United States Patent
Pendse (10) Patent No.: US 8,026,128 B2
(45) Date of Patent: Sep. 27, 2011

(54) SEMICONDUCTOR DEVICE AND METHOD OF SELF-CONFINEMENT OF CONDUCTIVE BUMP MATERIAL DURING REFLOW WITHOUT SOLDER MASK

(75) Inventor: Rajendra D. Pendse, Fremont, CA (US)

(73) Assignee: STATS ChipPAC, Ltd., Singapore (SG)

( * ) Notice: Subject to any disclaimer, the term of this patent is extended or adjusted under 35 U.S.C. 154(b) by 188 days.

(21) Appl. No.: 12/471,180

(22) Filed: May 22, 2009

(65) Prior Publication Data

US 2009/0250811 A1    Oct. 8, 2009

Related U.S. Application Data

(60) Continuation-in-part of application No. 12/062,293, filed on Apr. 3, 2008, now Pat. No. 7,700,407, which is a division of application No. 10/985,654, filed on Nov. 10, 2004, now Pat. No. 7,368,817.

(60) Provisional application No. 61/141,791, filed on Dec. 31, 2008.

(51) Int. Cl.
 H01L 21/44    (2006.01)
 H01L 23/48    (2006.01)

(52) U.S. Cl. ........ 438/107; 438/108; 438/612; 438/613; 257/734; 257/737; 257/778; 257/E23.021

(58) Field of Classification Search ................. 438/107, 438/108, 612–615; 257/734, 737, 778, E23.021
See application file for complete search history.

(56) References Cited

U.S. PATENT DOCUMENTS

| | | | |
|---|---|---|---|
| 6,049,122 A | 4/2000 | Yoneda | |
| 6,383,916 B1 | 5/2002 | Lin | |
| 6,409,073 B1 | 6/2002 | Kaskoun et al. | |
| 6,458,622 B1 | 10/2002 | Keser et al. | |
| 6,660,560 B2 | 12/2003 | Chaudhuri et al. | |
| 6,678,948 B1 | 1/2004 | Benzler et al. | |
| 6,774,497 B1 | 8/2004 | Qi et al. | |
| 6,821,878 B2 | 11/2004 | Danvir et al. | |
| 7,173,828 B2 | 2/2007 | Lin et al. | |
| 2001/0013423 A1 | 8/2001 | Dalal et al. | |
| 2006/0255473 A1 | 11/2006 | Pendse | |

*Primary Examiner* — Hsien Ming Lee
(74) *Attorney, Agent, or Firm* — Robert D. Atkins; Patent Law Group (57) ABSTRACT

A semiconductor device has a semiconductor die with an die bump pad and substrate with a trace line and integrated bump pad. Conductive bump material is deposited on the substrate bump pad or die bump pad. The semiconductor die over the substrate so that the bump material is disposed between the die bump pad and substrate bump pad. The bump material is reflowed without a solder mask around the die bump pad or substrate bump pad to form an interconnect. The bump material is self-confined within a footprint of the die bump pad or substrate bump pad. The bump material can be immersed in a flux solution prior to reflow to increase wettability. Alternatively, the interconnect includes a non-fusible base and fusible cap. The volume of bump material is selected so that a surface tension maintains self-confinement of the bump material within the bump pads during reflow.

25 Claims, 6 Drawing Sheets

SEMICONDUCTOR DEVICE AND METHOD OF SELF-CONFINEMENT OF CONDUCTIVE BUMP MATERIAL DURING REFLOW WITHOUT SOLDER MASK

CLAIM TO DOMESTIC PRIORITY

The present non-provisional application claims the benefit of priority of U.S. Provisional Application Ser. No. 61/141,791, filed Dec. 31, 2008. The present nonprovisional application is a continuation-in-part of U.S. application Ser. No. 12/062,293, now U.S. Pat. No. 7,700,407, filed Apr. 3, 2008, and which is a division of U.S. application Ser. No. 10/985,654, now U.S. Pat. No. 7,368,817, filed Nov. 10, 2004, entitled "Bump-on-Lead Flip Chip Interconnection" by Rajendra D. Pense.

FIELD OF THE INVENTION

The present invention relates in general to semiconductor devices and, more particularly, to a semiconductor device and method of providing self-confinement of conductive bump material during reflow without use of a solder mask.

BACKGROUND OF THE INVENTION

Semiconductor devices are commonly found in modern electronic products. Semiconductor devices vary in the number and density of electrical components. Discrete semiconductor devices generally contain one type of electrical component, e.g., light emitting diode (LED), small signal transistor, resistor, capacitor, inductor, and power metal oxide semiconductor field effect transistor (MOSFET). Integrated semiconductor devices typically contain hundreds to millions of electrical components. Examples of integrated semiconductor devices include microcontrollers, microprocessors, charged-coupled devices (CCDs), solar cells, and digital micro-mirror devices (DMDs).

Semiconductor devices perform a wide range of functions such as high-speed calculations, transmitting and receiving electromagnetic signals, controlling electronic devices, transforming sunlight to electricity, and creating visual projections for television displays. Semiconductor devices are found in the fields of entertainment, communications, power conversion, networks, computers, and consumer products. Semiconductor devices are also found in military applications, aviation, automotive, industrial controllers, and office equipment.

Semiconductor devices exploit the electrical properties of semiconductor materials. The atomic structure of semiconductor material allows its electrical conductivity to be manipulated by the application of an electric field or through the process of doping. Doping introduces impurities into the semiconductor material to manipulate and control the conductivity of the semiconductor device.

A semiconductor device contains active and passive electrical structures. Active structures, including bipolar and field effect transistors, control the flow of electrical current. By varying levels of doping and application of an electric field or base current, the transistor either promotes or restricts the flow of electrical current. Passive structures, including resistors, capacitors, and inductors, create a relationship between voltage and current necessary to perform a variety of electrical functions. The passive and active structures are electrically connected to form circuits, which enable the semiconductor device to perform high-speed calculations and other useful functions.

Semiconductor devices are generally manufactured using two complex manufacturing processes, i.e., front-end manufacturing, and back-end manufacturing, each involving potentially hundreds of steps. Front-end manufacturing involves the formation of a plurality of die on the surface of a semiconductor wafer. Each die is typically identical and contains circuits formed by electrically connecting active and passive components. Back-end manufacturing involves singulating individual die from the finished wafer and packaging the die to provide structural support and environmental isolation.

One goal of semiconductor manufacturing is to produce smaller semiconductor devices. Smaller devices typically consume less power, have higher performance, and can be produced more efficiently. In addition, smaller semiconductor devices have a smaller footprint, which is desirable for smaller end products. A smaller die size may be achieved by improvements in the front-end process resulting in die with smaller, higher density active and passive components. Back-end processes may result in semiconductor device packages with a smaller footprint by improvements in electrical interconnection and packaging materials.

Figure 1:
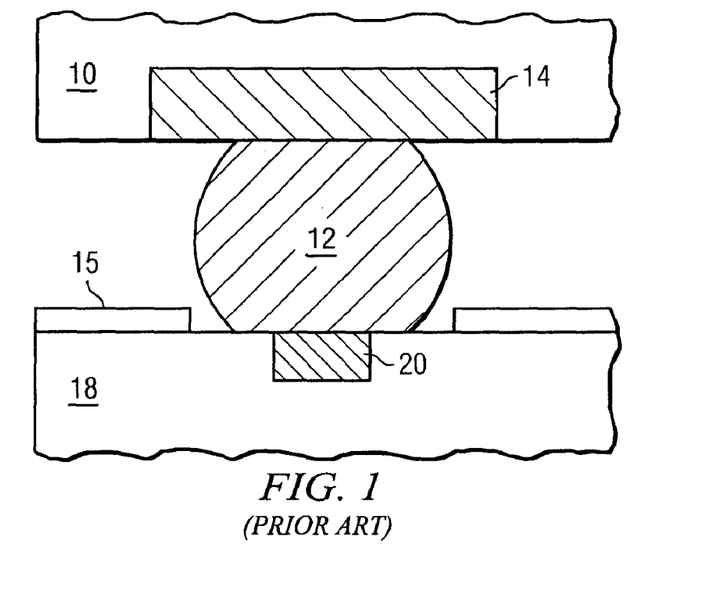
FIG. 1 illustrates a cross-sectional view of a conventional interconnect formed between a semiconductor die and trace line on a substrate.
Figure 2:
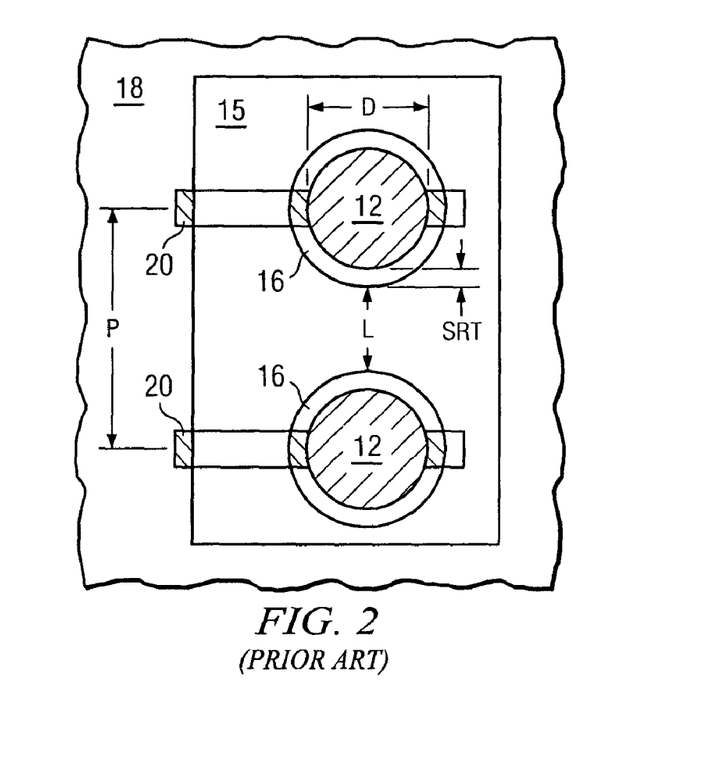
FIG. 2 illustrates a top view of the conventional interconnect formed over the trace line through a solder mask opening.

FIG. 1 illustrates a portion of flip chip type semiconductor device 10 with interconnect 12 metallurgically and electrically connected between bump pad 14 and trace line 20 using solder mask 15. A circular solder mask or registration opening (SRO) 16 is formed over substrate 18 to expose trace line 20, as shown in FIG. 2. Trace line 20 is a straight conductor with optional bump pad for mating to interconnect 12. SRO 16 confines the conductive bump material on the bump pad of trace line 20 during reflow and prevents the molten bump material from leeching onto the trace lines, which can cause electrical shorts to adjacent structures. SRO 16 is made larger than the trace line or bump pad. SRO 16 is typically circular in shape and made as small as possible to reduce the pitch of trace line 20 and increase routing density.

In typical design rules, the minimum escape pitch of trace line 20 is limited by the fact that SRO 16 must be at least as large as the base diameter (D) of interconnect 12 plus a solder mask registration tolerance (SRT). In addition, a minimum ligament (L) of solder mask material is needed between adjacent openings by virtue of the limits of the solder mask application process. More specifically, the minimum escape pitch is defined as $P=D+2*SRT+L$. In one embodiment, D is 100 micrometers ($\mu m$), SRT is 10 $\mu m$, and L is 60 $\mu m$, hence, the minimum escape pitch is $100+2*10+60=180$ $\mu m$.

Figure 3A:
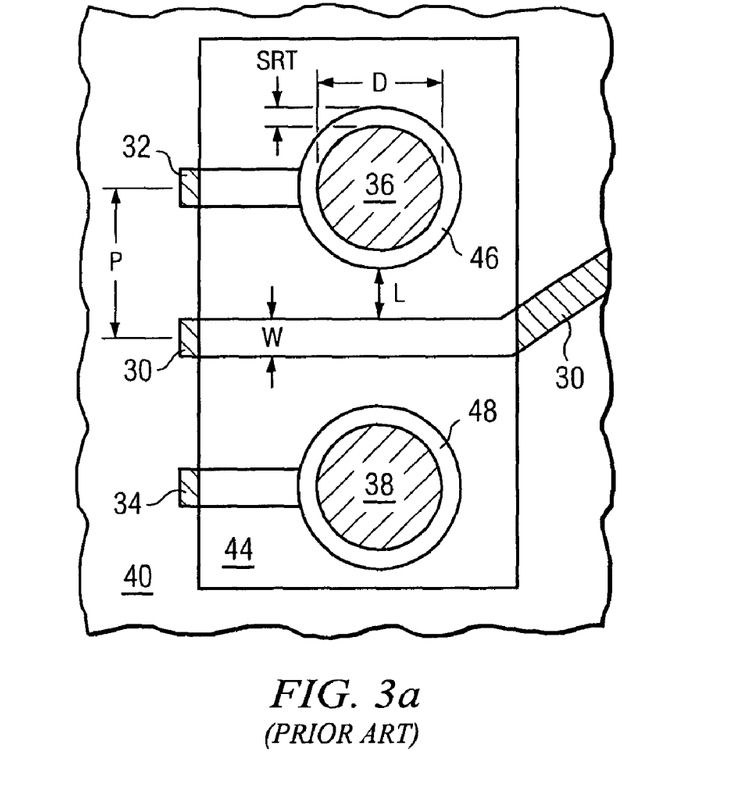
FIGS. 3a-3b illustrate conventional arrangement of trace lines between interconnects reflowed using a solder mask.
Figure 3B:
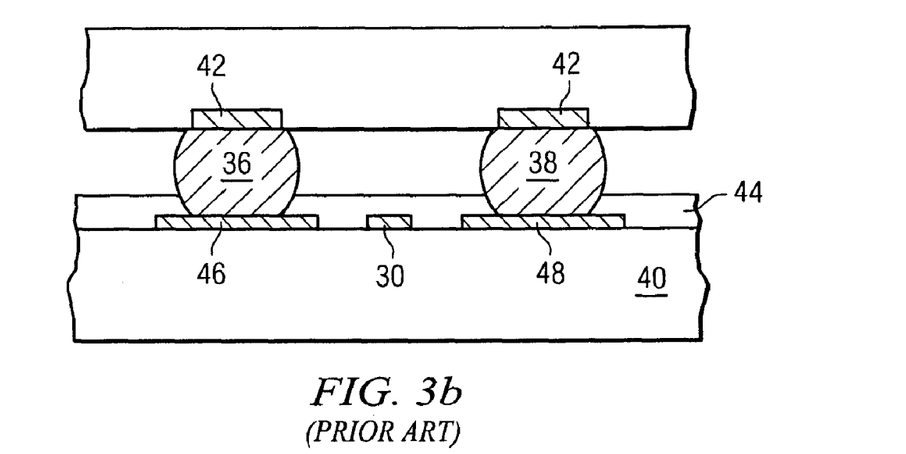

FIGS. 3a and 3b show a top view and cross-sectional view of another conventional arrangement with trace line 30 routed between traces lines 32 and 34 and bumps 36 and 38 on substrate 40. Bumps 36 and 38 electrically connect semiconductor die 42 to substrate 40. Solder mask 44 overlays bump pads 46 and 48. The minimum escape pitch of trace line 30 is defined by $P=D/2+SRT+L+W/2$, where D is bump base diameter, SRT is solder mask registration tolerance, W is trace line width, and L is the ligament separation between SRO and adjacent structures. In one embodiment, D is 100 $\mu m$, SRT is 10 $\mu m$, W is 30 $\mu m$, and L is 60 $\mu m$. The minimum escape pitch of trace lines 30-34 is $100/2+10+60+30/2=135$ $\mu m$. As the demand for high routing density increases, a smaller escape pitch is needed.

SUMMARY OF THE INVENTION

A need exists to minimize escape pitch of trace lines for higher routing density. Accordingly, in one embodiment, the present invention is a method of making a semiconductor device comprising the steps of providing a semiconductor die having a die bump pad, providing a substrate having a trace line with substrate bump pad, depositing conductive bump material on the substrate bump pad or die bump pad, mounting the semiconductor die over the substrate so that the conductive bump material is disposed between the die bump pad and substrate bump pad, and reflowing the conductive bump material without a solder mask around the die bump pad or substrate bump pad to form an interconnect. The conductive bump material is self-confined within a footprint of the die bump pad or substrate bump pad during reflow.

In another embodiment, the present invention is a method of making a semiconductor device comprising the steps of providing a first semiconductor structure having a first bump pad, providing a second semiconductor structure having a second bump pad, depositing conductive bump material between the first and second bump pads, and reflowing the conductive bump material without a solder mask around the first and second bump pads to form an interconnect. The conductive bump material is self-confined within the first and second bump pads during reflow.

In another embodiment, the present invention is a method of making a semiconductor device comprising the steps of depositing conductive bump material over a first bump pad, and reflowing the conductive bump material without a solder mask. The conductive bump material is self-confined within the first bump pad during reflow.

In another embodiment, the present invention is a semiconductor device comprising a semiconductor die having a first bump pad and substrate having a second bump pad. An interconnect is formed between the first and second bump pads by reflowing conductive bump material without a solder mask. The conductive bump material is self-confined within the first and second bump pads.

DETAILED DESCRIPTION OF THE DRAWINGS

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, resistors, and transformers, create a relationship between voltage and current necessary to perform electrical circuit functions.

Passive and active components are formed over the surface of the semiconductor wafer by a series of process steps including doping, deposition, photolithography, etching, and planarization. Doping introduces impurities into the semiconductor material by techniques such as ion implantation or thermal diffusion. The doping process modifies the electrical conductivity of semiconductor material in active devices, transforming the semiconductor material into an insulator, conductor, or dynamically changing the semiconductor material conductivity in response to an electric field or base current. Transistors contain regions of varying types and degrees of doping arranged as necessary to enable the transistor to promote or restrict the flow of electrical current upon the application of the electric field or base current.

Active and passive components are formed by layers of materials with different electrical properties. The layers can be formed by a variety of deposition techniques determined in part by the type of material being deposited. For example, thin film deposition may involve chemical vapor deposition (CVD), physical vapor deposition (PVD), electrolytic plating, and electroless plating processes. Each layer is generally patterned to form portions of active components, passive components, or electrical connections between components.

The layers can be patterned using photolithography, which involves the deposition of light sensitive material, e.g., photoresist, over the layer to be patterned. A pattern is transferred from a photomask to the photoresist using light. The portion of the photoresist pattern subjected to light is removed using a solvent, exposing portions of the underlying layer to be patterned. The remainder of the photoresist is removed, leaving behind a patterned layer. Alternatively, some types of materials are patterned by directly depositing the material into the areas or voids formed by a previous deposition/etch process using techniques such as electroless and electrolytic plating.

Depositing a thin film of material over an existing pattern can exaggerate the underlying pattern and create a non-uniformly flat surface. A uniformly flat surface is required to produce smaller and more densely packed active and passive components. Planarization can be used to remove material from the surface of the wafer and produce a uniformly flat surface. Planarization involves polishing the surface of the wafer with a polishing pad. An abrasive material and corrosive chemical are added to the surface of the wafer during polishing. The combined mechanical action of the abrasive and corrosive action of the chemical removes any irregular topography, resulting in a uniformly flat surface.

Back-end manufacturing refers to cutting or singulating the finished wafer into the individual die and then packaging the die for structural support and environmental isolation. To singulate the die, the wafer is scored and broken along nonfunctional regions of the wafer called saw streets or scribes.

The wafer is singulated using a laser cutting tool or saw blade. After singulation, the individual die are mounted to a package substrate that includes pins or contact pads for interconnection with other system components. Contact pads formed over the semiconductor die are then connected to contact pads within the package. The electrical connections can be made with solder bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

Figure 4:
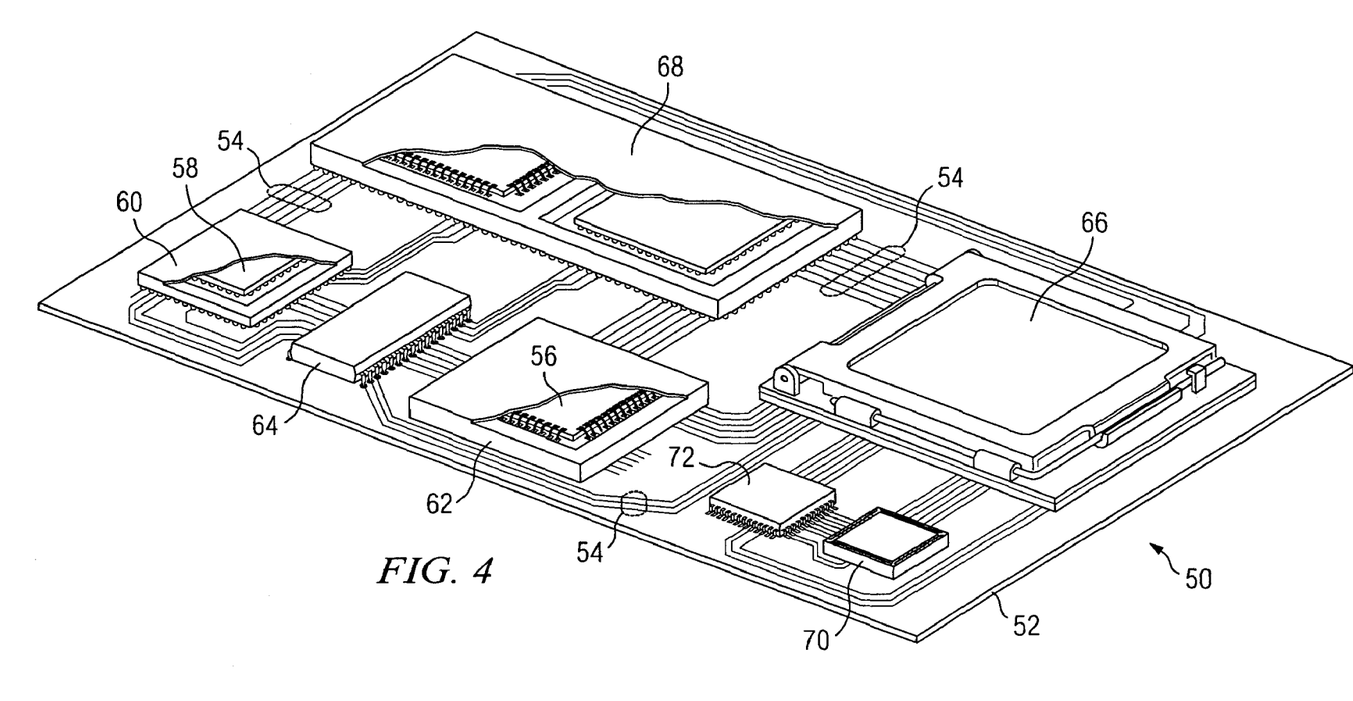
FIG. 4 illustrates a PCB with different types of packages mounted to its surface.

FIG. 4 illustrates electronic device 50 having a chip carrier substrate or PCB 52 with a plurality of semiconductor packages mounted on its surface. Electronic device 50 may have one type of semiconductor package, or multiple types of semiconductor packages, depending on the application. The different types of semiconductor packages are shown in FIG. 4 for purposes of illustration.

Electronic device 50 may be a stand-alone system that uses the semiconductor packages to perform one or more electrical functions. Alternatively, electronic device 50 may be a subcomponent of a larger system. For example, electronic device 50 may be a graphics card, network interface card, or other signal processing card that can be inserted into a computer. The semiconductor package can include microprocessors, memories, application specific integrated circuits (ASICs), logic circuits, analog circuits, RF circuits, discrete devices, or other semiconductor die or electrical components.

In FIG. 4, PCB 52 provides a general substrate for structural support and electrical interconnect of the semiconductor packages mounted on the PCB. Conductive signal traces 54 are formed over a surface or within layers of PCB 52 using evaporation, electrolytic plating, electroless plating, screen printing, or other suitable metal deposition process. Signal traces 54 provide for electrical communication between each of the semiconductor packages, mounted components, and other external system components. Traces 54 also provide power and ground connections to each of the semiconductor packages.

In some embodiments, a semiconductor device has two packaging levels. First level packaging is a technique for mechanically and electrically attaching the semiconductor die to an intermediate carrier. Second level packaging involves mechanically and electrically attaching the intermediate carrier to the PCB. In other embodiments, a semiconductor device may only have the first level packaging where the die is mechanically and electrically mounted directly to the PCB.

For the purpose of illustration, several types of first level packaging, including wire bond package 56 and flip chip 58, are shown on PCB 52. Additionally, several types of second level packaging, including ball grid array (BGA) 60, bump chip carrier (BCC) 62, dual in-line package (DIP) 64, land grid array (LGA) 66, multi-chip module (MCM) 68, quad flat non-leaded package (QFN) 70, and quad flat package 72, are shown mounted on PCB 52. Depending upon the system requirements, any combination of semiconductor packages, configured with any combination of first and second level packaging styles, as well as other electronic components, can be connected to PCB 52. In some embodiments, electronic device 50 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using cheaper components and a streamlined manufacturing process. The resulting devices are less likely to fail and less expensive to manufacture resulting in a lower cost for consumers.

Figure 5A:
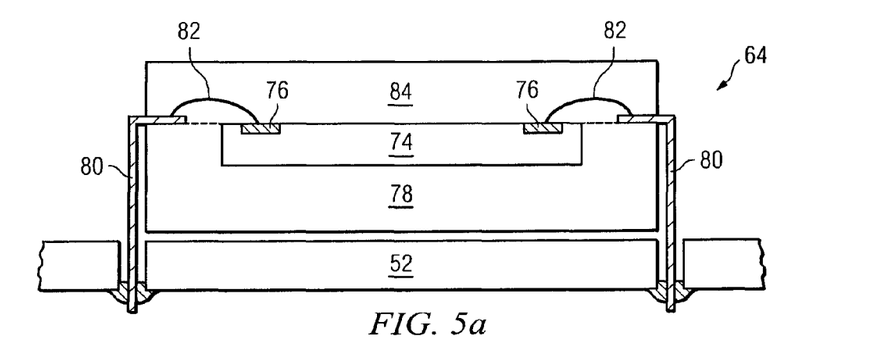
FIGS. 5a-5d illustrate further detail of the representative semiconductor packages mounted to the PCB.

FIGS. 5a-5d show exemplary semiconductor packages. FIG. 5a illustrates further detail of DIP 64 mounted on PCB 52. Semiconductor die 74 includes an active region containing analog or digital circuits implemented as active devices, passive devices, conductive layers, and dielectric layers formed within the die and are electrically interconnected according to the electrical design of the die. For example, the circuit may include one or more transistors, diodes, inductors, capacitors, resistors, and other circuit elements formed within the active region of semiconductor die 74. Contact pads 76 are one or more layers of conductive material, such as aluminum (Al), copper (Cu), tin (Sn), nickel (Ni), gold (Au), or silver (Ag), and are electrically connected to the circuit elements formed within semiconductor die 74. During assembly of DIP 64, semiconductor die 74 is mounted to an intermediate carrier 78 using a gold-silicon eutectic layer or adhesive material such as thermal epoxy. The package body includes an insulative packaging material such as polymer or ceramic. Conductor leads 80 and wire bonds 82 provide electrical interconnect between semiconductor die 74 and PCB 52. Encapsulant 84 is deposited over the package for environmental protection by preventing moisture and particles from entering the package and contaminating die 74 or wire bonds 82.

Figure 5B:
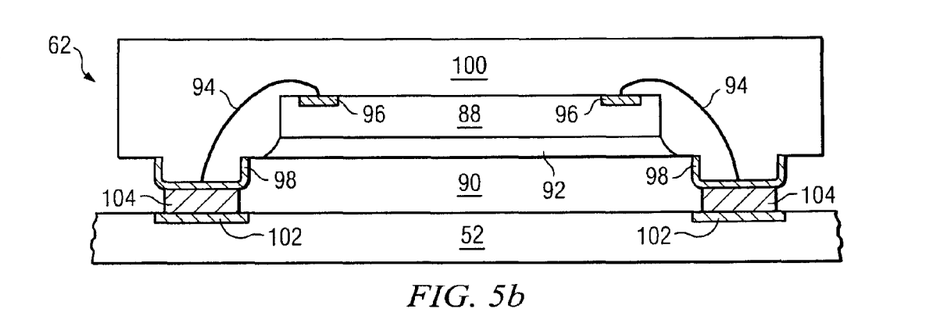

FIG. 5b illustrates further detail of BCC 62 mounted on PCB 52. Semiconductor die 88 is mounted over carrier 90 using an underfill or epoxy-resin adhesive material 92. Wire bonds 94 provide first level packing interconnect between contact pads 96 and 98. Molding compound or encapsulant 100 is deposited over semiconductor die 88 and wire bonds 94 to provide physical support and electrical isolation for the device. Contact pads 102 are formed over a surface of PCB 52 using a suitable metal deposition such electrolytic plating or electroless plating to prevent oxidation. Contact pads 102 are electrically connected to one or more conductive signal traces 54 in PCB 52. Bumps 104 are formed between contact pads 98 of BCC 62 and contact pads 102 of PCB 52.

Figure 5C:
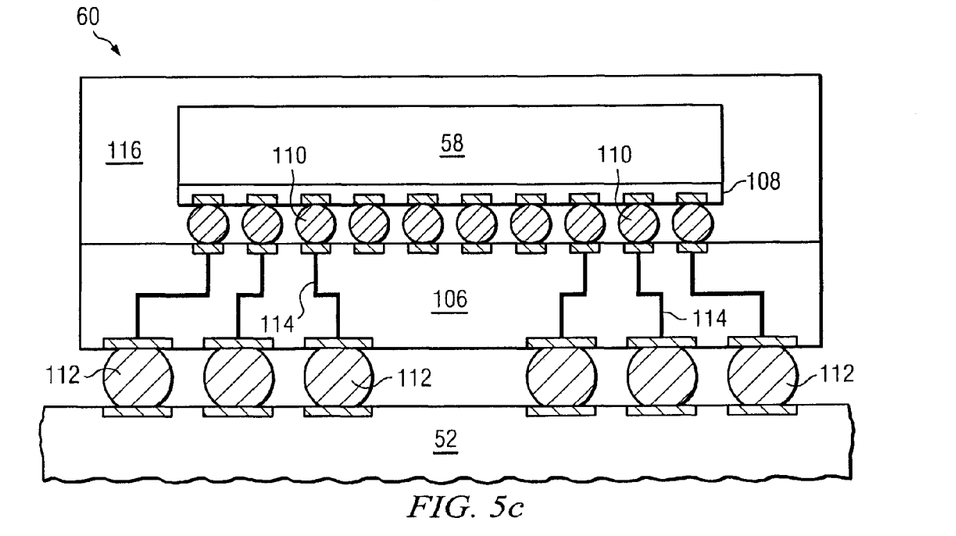

Flip chip semiconductor packages and wafer level packages (WLP) are commonly used with integrated circuits (ICs) demanding high speed, high density, and greater pin count. In FIG. 5c, semiconductor die 58 is mounted face down to intermediate carrier 106 with a flip chip style first level packaging. Active region 108 of semiconductor die 58 contains analog or digital circuits implemented as active devices, passive devices, conductive layers, and dielectric layers formed according to the electrical design of the die. For example, the circuit may include one or more transistors, diodes, inductors, capacitors, resistors, and other circuit elements within active region 108. Semiconductor die 58 is electrically and mechanically connected to carrier 106 through interconnects 110.

BGA 60 is electrically and mechanically connected to PCB 52 with a BGA style second level packaging using interconnects 112. Semiconductor die 58 is electrically connected to conductive signal traces 54 in PCB 52 through interconnects 110, signal lines 114, and interconnects 112. A molding compound or encapsulant 116 is deposited over semiconductor die 58 and carrier 106 to provide physical support and electrical isolation for the device. The flip chip semiconductor device provides a short electrical conduction path from the active devices on semiconductor die 58 to conduction tracks on PCB 52 in order to reduce signal propagation distance, lower capacitance, and improve overall circuit performance.

Figure 5D:
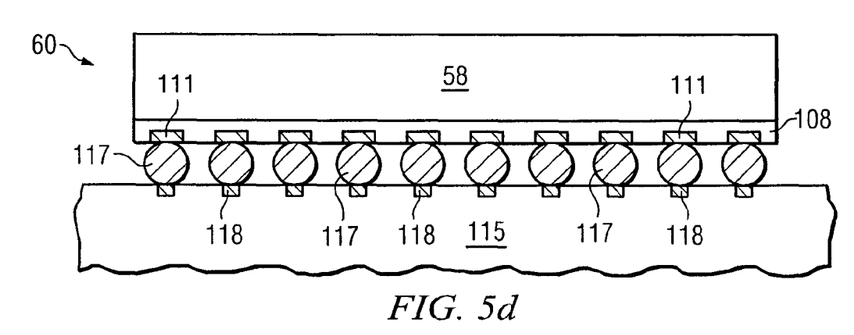

In another embodiment, active area 108 of semiconductor die 58 is directly mounted facedown to PCB 115, i.e., without an intermediate carrier, as shown in FIG. 5*d*. Bump pads 111 are formed on active area 108 using an evaporation, electrolytic plating, electroless plating, screen printing, or other suitable metal deposition process. Bump pads 111 connect to the active and passive circuits by conduction tracks in active area 108. Bump pads 111 can be Al, Sn, Ni, Au, Ag, or Cu. An electrically conductive bump material is deposited over bump pads 111 using an evaporation, electrolytic plating, electroless plating, ball drop, or screen printing process. The bump material can be Al, Sn, Ni, Au, Ag, lead (Pb), Bi, Cu, solder, and combinations thereof, with an optional flux material. For example, the bump material can be eutectic Sn/Pb, high-lead solder, or lead-free solder. The bump material is bonded to die bump pads 160 using a suitable attachment or bonding process. In one embodiment, the bump material is reflowed by heating the material above its melting point to form spherical balls or bumps 117. In some applications, bumps 117 are reflowed a second time to improve electrical contact to bump pads 111. The flip chip semiconductor device provides a short electrical conduction path from the active devices on semiconductor die 58 to conduction tracks on PCB 115 in order to reduce signal propagation, lower capacitance, and achieve overall better circuit performance.

Figure 6A:
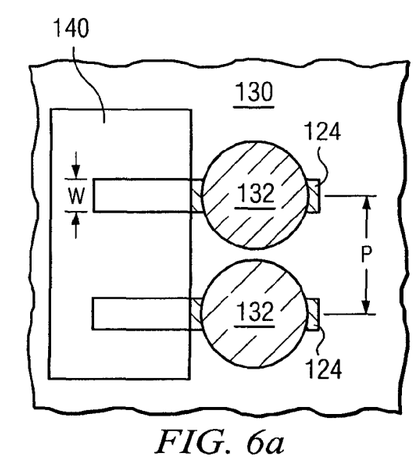
FIGS. 6a-6b is a semiconductor device with interconnects reflowed on trace lines without a solder mask.
Figure 6B:
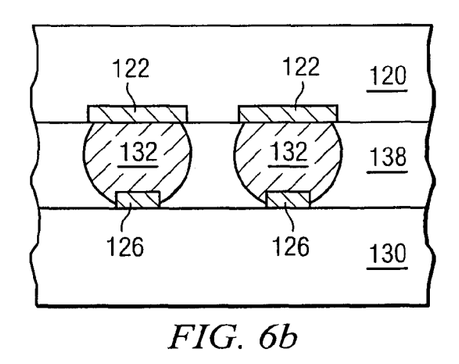
Figure 7A:
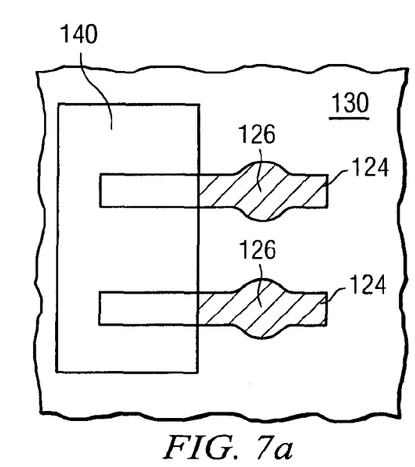
FIGS. 7a-7b show further detail of the bump pad along the trace line.
Figure 7B:
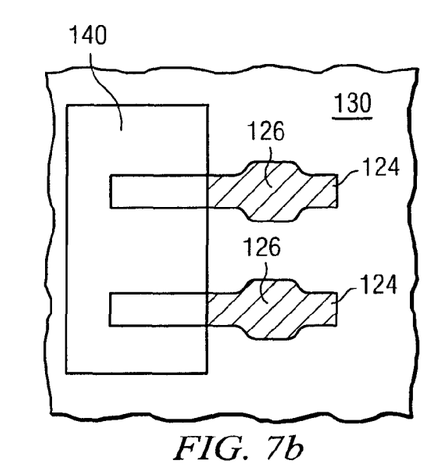

FIGS. 6*a* and 6*b* illustrate a top view and cross-sectional view of a portion of flip chip type semiconductor die 120 with die bump pad 122. Trace line 124 is a straight conductor with integrated bump pad 126 formed on substrate or PCB 130. FIGS. 7*a* and 7*b* show further detail of substrate bump pad 126 along trace line 124. The substrate bump pad 126 can be rounded as shown in FIG. 7*a*, or rectangular as shown in FIG. 7*b*. The sides of substrate bump pad 126 may be co-linear with trace line 124.

An electrically conductive bump material is deposited over die bump pad 122 or substrate bump pad 126 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to die bump pad 122 and substrate bump pad 126 using a suitable attachment or bonding process. In one embodiment, the bump material is reflowed by heating the material above its melting point to form interconnect 132. In some applications, interconnect 132 is reflowed a second time to improve electrical contact between die bump pad 122 and substrate bump pad 126. The bump material around the narrow substrate bump pad 126 maintains die placement during reflow. Although interconnect 132 is shown connected to trace line 124 as a bump-on-lead (BOL), the interconnect can also be formed over a bump pad on substrate 130 having an area on the same order or greater than die bump pad 122. An optional underfill material 138 is deposited between semiconductor die 120 and substrate 130.

In high routing density applications, it is desirable to minimize escape pitch of trace lines 124. The escape pitch between trace lines 124 can be reduced by eliminating the solder mask for reflow containment, i.e., by reflowing the bump material without a solder mask. Solder mask 140 may be formed over a portion of substrate 130. However, solder mask 140 is not formed over substrate bump pad 126 or trace line 124 for reflow containment. That is, the portion of trace line 124 designed to mate with the bump material is devoid of any SRO of solder mask 140. Since no SRO is formed around die bump pad 122 or substrate bump pad 126, trace lines 124 can be formed with a finer pitch, i.e., trace lines 124 can be disposed closer together or to nearby structures. Without solder mask 140, the pitch between trace lines 124 is given as $P=D+PLT+W/2$, wherein D is the base diameter of interconnect 132, PLT is die placement tolerance, and W is the width of the trace line 124. In one embodiment, given a bump base diameter of 100 μm, PLT of 10 μm, and trace line width of 30 μm, the minimum escape pitch of trace line 124 is 125 μm. The solder mask-less bump formation eliminates the need to account for the ligament spacing of solder mask material between adjacent openings, SRT, and minimum resolvable SRO, as found in the prior art.

When the bump material is reflowed without a solder mask to metallurgically and electrically connect die bump pad 122 to substrate bump pad 126, the wetting and surface tension causes the bump material to maintain self-confinement and be retained within the space between die bump pad 122 and substrate bump pad 126 and portion of substrate 130 immediately adjacent to trace line 124 substantially within the footprint of the bump pads.

To achieve the desired self-confinement property, the bump material can be immersed in a flux solution prior to placement on die bump pad 122 or substrate bump pad 126 to selectively render the region contacted by the bump material more wettable than the surrounding area of trace line 124. The molten bump material remains confined substantially within the area defined by the bump pads due to the wettable properties of the flux solution. The bump material does not run-out to the less wettable areas. A thin oxide layer or other insulating layer can be formed over areas where bump material is not intended to make the area less wettable. Hence, solder mask 140 is not needed around die bump pad 122 or substrate bump pad 126.

Figure 8:
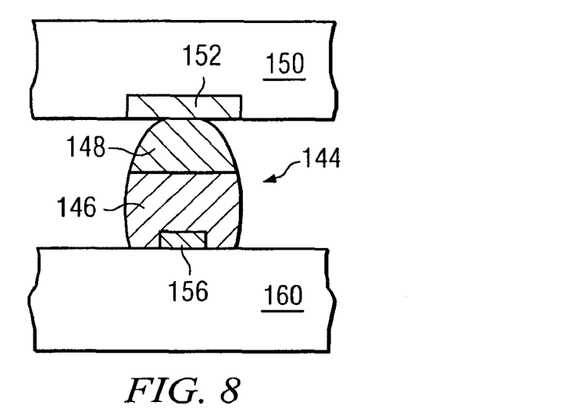
FIG. 8 shows a composite interconnect with non-fusible base and fusible cap.

In another embodiment, a composite interconnect 144 is formed between die bump pad 122 and substrate bump pad 126 to achieve the desired self-confinement of the bump material. Composite interconnect 144 includes a non-fusible base 146 made of Cu, Au, Sn, Ni, and Pb, and a fusible cap 148 made of solder, Sn, or indium, as shown in FIG. 8. The volume of fusible bump material in relation to the non-fusible base material is selected to ensure self-confinement by virtue of surface tension forces. During reflow, the fusible base material is self-confined around the non-fusible base material. The fusible bump material around the non-fusible base also maintains die placement during reflow. In general, the height of composite interconnect 144 is the same or less than the diameter of the bump. In some cases, the height of composite interconnect 144 is greater than the diameter of the interconnect. In one embodiment, given a bump base diameter of 100 μm, the non-fusible base 146 is about 45 μm in height and the fusible cap 148 is about 35 μm in height. The molten bump material remains confined substantially within the area defined by the bump pads because the volume of bump material deposited to form composite bump 144, including non-fusible base 146 and fusible cap 148, is selected so that the resulting surface tension is sufficient to retain the bump material substantially within the footprint of the bump pads and prevent run-out to unintended adjacent or nearby areas. Hence, solder mask 140 is not needed around die bump pad 122 or substrate bump pad 126, which reduces trace line pitch and increases routing density.

Figure 9A:
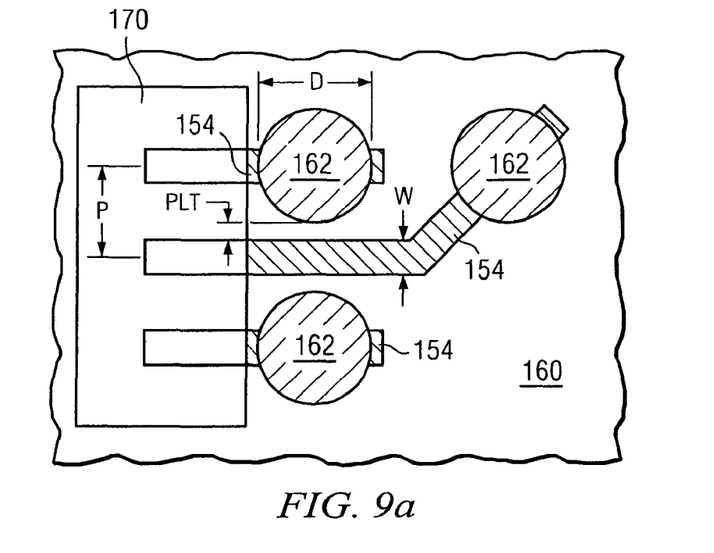
FIGS. 9a-9b illustrate an alternate embodiment of the semiconductor device with interconnects reflowed on trace lines without a solder mask.
Figure 9B:
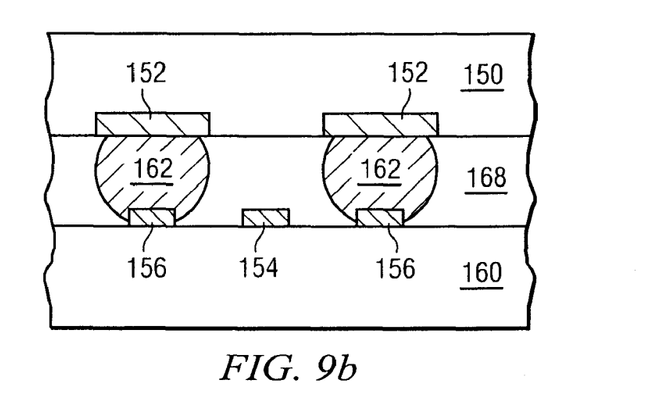

FIGS. 9*a* and 9*b* illustrate a top view and cross-sectional view of another embodiment with flip chip type semiconductor die 150 having die bump pad 152. Trace line 154 is a straight conductor with integrated bump pad 156 formed on substrate or PCB 160, similar to FIGS. 7*a* and 7*b*. In this embodiment, bump pads 156 are arranged in multiple or offset rows. Accordingly, alternate trace lines 154 include an elbow for routing to bump pads 156.

An electrically conductive bump material is deposited over die bump pad 152 or substrate bump pad 156 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to die bump pad 152 and substrate bump pad 156 using a suitable attachment or bonding process. In one embodiment, the bump material is reflowed by heating the material above its melting point to form interconnect 162. In some applications, interconnect 162 is reflowed a second time to improve electrical contact between die bump pad 152 and substrate bump pad 156. The bump material around the narrow substrate bump pad 156 maintains die placement during reflow. Although interconnect 162 is shown connected to trace line 154 as BOL, the bump material can also be reflowed over a bump pad on substrate 160 having an area on the same order or greater than die bump pad 152. An optional underfill material 168 is deposited between semiconductor die 150 and substrate 160.

In high routing density applications, it is desirable to minimize escape pitch. In order to reduce the pitch between trace lines 154, the bump material is reflowed without a solder mask. The escape pitch between trace lines 154 can be reduced by eliminating the solder mask for solder reflow containment, i.e., by reflowing the bump material without a solder mask. Solder mask 170 may be formed over a portion of substrate 160. However, solder mask 170 is not formed over substrate bump pad 156 of trace line 154 for solder reflow containment. That is, the portion of trace line 154 designed to mate with the bump material is devoid of an SRO of solder mask 170. Since no SRO is formed around die bump pad 152 or substrate bump pad 156, trace lines 154 can be formed with a finer pitch, i.e., trace lines 154 can be disposed closer to adjacent structures.

Without solder mask 170, the pitch between trace lines 154 is given as P=D/2+PLT+W/2, wherein D is the base diameter of bump 162, PLT is die placement tolerance, and W is the width of the trace line 154. In one embodiment, given a bump diameter of 100 μm, PLT of 10 μm, and trace line width of 30 μm, the minimum escape pitch of trace line 154 is 75 μm. The solder mask-less bump formation eliminates the need to account for the ligament spacing of solder mask material between adjacent openings, SRT, and minimum resolvable SRO, as found in the prior art.

When the bump material is reflowed without a solder mask to metallurgically and electrically connect die bump pad 152 of semiconductor die 150 to substrate bump pad 156 of trace line 154, the wetting and surface tension causes the bump to maintain self-confinement and be retained within the space between die bump pad 152 and substrate bump pad 156 and portion of substrate 160 immediately adjacent to trace line 154 substantially within the footprint of the bump pads.

To achieve the desired self-confinement property, the bump material can be immersed in a flux solution prior to placement on die bump pad 152 or substrate bump pad 156 to selectively render the region contacted by the bump material more wettable than the surrounding area of trace line 154. The molten bump material remains confined substantially within the area defined by the bump pads due to the wettable properties of the flux solution. The bump material does not run-out to the less wettable areas. A thin oxide layer or other insulating layer can be formed over areas where bump material is not intended to make the area less wettable. Hence, solder mask 170 is not needed around die bump pad 152 or substrate bump pad 156.

In another embodiment, a composite interconnect is formed between die bump pad 152 and substrate bump pad 156 to achieve the desired self-confinement of the bump material. The composite interconnect includes a non-fusible base made of Cu, Au, Sn, Ni, or Pb, and a fusible cap made of solder, Sn, or indium, similar to FIG. 8. The height or volume of fusible bump material in relation to the non-fusible base material is selected to ensure self-confinement by virtue of surface tension forces. During reflow, the fusible base material is self-confined around the non-fusible base material. The fusible bump material around the non-fusible base also maintains die placement during reflow. In general the height of the composite interconnect is the same or less than the diameter of the bump. In some cases, the height of the composite interconnect is greater than the diameter of the interconnect. In one embodiment, given a bump base diameter of 100 μm, the non-fusible base is about 45 μm in height and the fusible cap is about 35 μm in height. The molten bump material remains confined substantially within the area defined by the bump pads because the volume of bump material deposited to form the composite bump, including non-fusible base and fusible cap, is selected so that the resulting surface tension is sufficient to retain the bump material substantially within the footprint of the bump pads and prevent run-out to unintended adjacent or nearby areas. Hence, solder mask 170 is not needed around die bump pad 152 or substrate bump pad 156, which reduces trace line pitch and increases routing density.

While one or more embodiments of the present invention have been illustrated in detail, the skilled artisan will appreciate that modifications and adaptations to those embodiments may be made without departing from the scope of the present invention as set forth in the following claims.

What is claimed:

1. A method of making a semiconductor device, comprising:
   providing a semiconductor die having a die bump pad;
   providing a substrate having a trace line with substrate bump pad;
   depositing conductive bump material on the substrate bump pad or die bump pad;
   mounting the semiconductor die over the substrate so that the conductive bump material is disposed between the die bump pad and substrate bump pad; and
   reflowing the conductive bump material without a solder mask around the die bump pad or substrate bump pad to form an interconnect, wherein the conductive bump material is self-confined within a footprint of the die bump pad or substrate bump pad during reflow.

2. The method of claim 1, wherein the conductive bump material is immersed in a flux solution prior to reflow to increase wettability.

3. The method of claim 1, further including forming an insulating layer on an area around the die bump pad or substrate bump pad to make the area less wettable than the die bump pad and substrate bump pad.

4. The method of claim 1, wherein the interconnect includes a non-fusible base and fusible cap.

5. The method of claim 1, wherein a volume of conductive bump material deposited between the die bump pad and substrate bump pad is selected so that a surface tension maintains self-confinement of the conductive bump material substantially within the footprint of the die bump pad and substrate bump pad during reflow.

6. The method of claim 1, wherein a height of the interconnect is equal to or less than a diameter of the interconnect.

7. A method of making a semiconductor device, comprising:
- providing a semiconductor die having a die bump pad;
- providing a substrate having a trace line with substrate bump pad;
- depositing conductive bump material on the substrate bump pad or die bump pad;
- mounting the semiconductor die over the substrate so that the conductive bump material is disposed between the die bump pad and substrate bump pad; and
- reflowing the conductive bump material without a solder mask around the die bump pad or substrate bump pad to form an interconnect, wherein the conductive bump material is self-confined within a footprint of the die bump pad or substrate bump pad during reflow, wherein an escape pitch of the trace line is given $D+PLT+W/2$, wherein D is a base diameter of the interconnect, PLT is die placement tolerance, and W is the width of the trace line.

8. A method of making a semiconductor device, comprising:
- providing a semiconductor die having a die bump pad;
- providing a substrate having a trace line with substrate bump pad;
- depositing conductive bump material on the substrate bump pad or die bump pad;
- mounting the semiconductor die over the substrate so that the conductive bump material is disposed between the die bump pad and substrate bump pad; and
- reflowing the conductive bump material without a solder mask around the die bump pad or substrate bump pad to form an interconnect, wherein the conductive bump material is self-confined within a footprint of the die bump pad or substrate bump pad during reflow, wherein an escape pitch of the trace line is given $D/2+PLT+W/2$, wherein D is a base diameter of the interconnect, PLT is die placement tolerance, and W is the width of the trace line.

9. A method of making a semiconductor device, comprising:
- providing a first semiconductor structure having a first bump pad;
- providing a second semiconductor structure having a second bump pad;
- depositing conductive bump material between the first and second bump pads; and
- reflowing the conductive bump material without a solder mask around the first and second bump pads to form an interconnect, wherein the conductive bump material is self-confined within a footprint of the first bump pad or second bump pad during reflow.

10. The method of claim 9, wherein the conductive bump material is immersed in a flux solution prior to reflow to increase wettability.

11. The method of claim 9, further including forming an insulating layer on an area around the first bump pad or second bump pad to make the area less wettable than the first and second bump pads.

12. The method of claim 9, wherein the interconnect includes a non-fusible base and fusible cap.

13. The method of claim 9, wherein the volume of conductive bump material deposited between the first and second bump pads is selected so that a surface tension maintains self-confinement of the conductive bump material substantially within the first and second bump pads during reflow.

14. The method of claim 9, wherein a height of the interconnect is equal to or less than a diameter of the interconnect.

15. A method of making a semiconductor device, comprising:
- depositing conductive bump material over a first bump pad; and
- reflowing the conductive bump material without a solder mask, wherein the conductive bump material is self-confined within a footprint of the first bump pad during reflow and an escape pitch of the trace line is given $D+PLT+W/2$, wherein D is a base diameter of the interconnect, PLT is die placement tolerance, and W is the width of the trace line.

16. The method of claim 15, wherein the conductive bump material is immersed in a flux solution prior to reflow to increase wettability.

17. The method of claim 15, further including forming an insulating layer on an area around the first bump pad to make the area less wettable than the first bump pad.

18. The method of claim 15, wherein reflowing the conductive bump material forms an interconnect.

19. The method of claim 18, wherein a height of the interconnect is equal to or less than a diameter of the interconnect.

20. The method of claim 15, wherein the volume of conductive bump material deposited over the first bump pad is selected so that a surface tension maintains self-confinement of the conductive bump material.

21. A semiconductor device, comprising:
- a semiconductor die having a first bump pad;
- a substrate having a second bump pad;
- an interconnect formed between the first and second bump pads by reflowing conductive bump material without a solder mask, wherein the conductive bump material is self-confined within a footprint of the first pump pad or second bump pad.

22. The semiconductor device of claim 21, wherein the conductive bump material is immersed in a flux solution prior to reflow to increase wettability.

23. The semiconductor device of claim 21, further including an insulating layer formed on an area around the first bump pad or second bump pad to make the area less wettable than the first and second bump pads.

24. The semiconductor device of claim 21, wherein the interconnect includes a non-fusible base and fusible cap.

25. The semiconductor device of claim 21, wherein the volume of conductive bump material deposited between the first and second bump pads is selected so that a surface tension maintains self-confinement of the conductive bump material substantially within the first and second bump pads during reflow.

* * * * *

UNITED STATES PATENT AND TRADEMARK OFFICE
CERTIFICATE OF CORRECTION

| | |
|---|---|
| PATENT NO. | : 8,026,128 B2 |
| APPLICATION NO. | : 12/471180 |
| DATED | : September 27, 2011 |
| INVENTOR(S) | : Rajendra D. Pendse |

It is certified that error appears in the above-identified patent and that said Letters Patent is hereby corrected as shown below:

Column 10, claim 1, line 39, insert -- a -- after the word "with".

Column 11, claim 7, line 4, insert -- a -- after the word "with".

Column 11, claim 7, line 18, replace the first "the" with -- a --.

Column 11, claim 8, line 23, insert -- a -- after the word "with".

Column 11, claim 8, line 37, replace the first "the" with -- a --.

Column 12, claim 13, line 3, replace the second "the" with -- a --.

Column 12, claim 15, line 12, delete the word "first".

Column 12, claim 15, line 16, delete the word "first".

Column 12, claim 15, line 17, replace the word "the" with -- a --.

Column 12, claim 15, line 18, replace the word "the" with -- a --.

Column 12, claim 15, line 19, replace the word "the" with -- a --.

Column 12, claim 17, line 25, delete the word "first".

Column 12, claim 17, line 26, delete the word "first".

Column 12, claim 18, line 28, replace the word "an" with -- the --.

Column 12, claim 20, line 31, replace the word "the" with -- a --.

Column 12, claim 20, line 32, delete the word "first".

Column 12, claim 21, line 41, replace the word "pump" with -- bump --.

Signed and Sealed this
Thirteenth Day of December, 2011

David J. Kappos
*Director of the United States Patent and Trademark Office*

Column 12, claim 25, line 52, replace the word "the" with -- a --.